US011333694B2

(12) United States Patent
Mori et al.

(10) Patent No.: US 11,333,694 B2
(45) Date of Patent: May 17, 2022

(54) ALARM SIGNAL GENERATOR CIRCUIT AND ALARM SIGNAL GENERATION METHOD

(71) Applicant: FUJI ELECTRIC CO., LTD., Kawasaki (JP)

(72) Inventors: Takahiro Mori, Matsumoto (JP); Akira Nakamori, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 970 days.

(21) Appl. No.: 14/329,024

(22) Filed: Jul. 11, 2014

(65) Prior Publication Data
US 2014/0320297 A1 Oct. 30, 2014

Related U.S. Application Data

(63) Continuation of application No. PCT/JP2013/000441, filed on Jan. 28, 2013.

(30) Foreign Application Priority Data

Apr. 4, 2012 (JP) .............................. JP2012-085378

(51) Int. Cl.
*G01R 23/15* (2006.01)
*G01R 31/42* (2006.01)
(Continued)

(52) U.S. Cl.
CPC ............. *G01R 23/15* (2013.01); *G01R 31/42* (2013.01); *H03K 17/18* (2013.01); *H02M 1/32* (2013.01)

(58) Field of Classification Search
CPC ........ G01R 23/15; G01R 31/42; H03K 17/18; H02M 1/32
See application file for complete search history.

(56) References Cited

U.S. PATENT DOCUMENTS

| 5,869,996 A * | 2/1999 | Okumura | ................ H02M 1/32 327/512 |
| 6,473,280 B1 * | 10/2002 | Buxton | .................... H02M 1/32 307/140 |
| 2002/0039269 A1 * | 4/2002 | Kumagai | ............... H03K 17/18 361/93.1 |

(Continued)

FOREIGN PATENT DOCUMENTS

| CN | 1989682 A | 6/2007 |
| CN | 102299507 A | 12/2011 |

(Continued)

OTHER PUBLICATIONS

Extended European Search Report issued in EP13772550.3, dated Feb. 11, 2016.
(Continued)

*Primary Examiner* — James J Yang
(74) *Attorney, Agent, or Firm* — Rossi, Kimms & McDowell LLP

(57) ABSTRACT

With regard to an instrument wherein a plurality of phase operations are carried out, the type of failure or the phase in which the failure has occurred is determined and, in accordance with the result of the determination, an alarm signal is generated. Provided that the failure details and the phase in which the failure has occurred can be determined from the generated alarm signal, it is possible, using a configuration wherein an alarm signal having a pulse number corresponding to the phase in which a failure has occurred is generated, or a configuration wherein an alarm signal having a pulse width corresponding to the phase in which a failure has occurred is generated, to determine the type of failure that has occurred and the phase in which the failure has occurred from the pulse number and pulse width.

13 Claims, 10 Drawing Sheets

(51) Int. Cl.
*H03K 17/18* (2006.01)
*H02M 1/32* (2007.01)

(56) References Cited

U.S. PATENT DOCUMENTS

| | | | |
|---|---|---|---|
| 2007/0189675 A1 | 8/2007 | Nagatsuka | |
| 2011/0148378 A1* | 6/2011 | Grek | H02M 3/33507 323/283 |
| 2011/0176637 A1* | 7/2011 | Hu | H04L 1/0079 375/316 |
| 2011/0317315 A1 | 12/2011 | Motohashi et al. | |
| 2013/0069613 A1* | 3/2013 | Nakase | H02M 3/156 323/284 |

FOREIGN PATENT DOCUMENTS

| | | | |
|---|---|---|---|
| JP | 354093411 A * | 7/1979 | |
| JP | 63-031478 A | 2/1988 | |
| JP | 05-030771 A | 2/1993 | |
| JP | 06303211 | 10/1994 | |
| JP | 08-149868 A | 6/1996 | |
| JP | 1117508 | 1/1999 | |
| JP | 2003-088093 A | 3/2003 | |
| JP | 2006-262599 A | 9/2006 | |
| JP | 2007082360 A | 3/2007 | |
| JP | 2008216040 A * | 9/2008 | |
| JP | 2008216040 A * | 9/2008 | |
| JP | 2012-147573 A | 8/2012 | |

OTHER PUBLICATIONS

Office Action issued in Chinese Appln. No. 201380005364.2 dated Feb. 1, 2016. English translation provided.
Office Action issued in JP2014-509005, dated May 7, 2015. English translation provided.

* cited by examiner

_(1)_

ALARM SIGNAL GENERATOR CIRCUIT AND ALARM SIGNAL GENERATION METHOD

CROSS-REFERENCE TO RELATED APPLICATIONS

This application is a continuation of International Application No. PCT/JP2013/000441, filed on Jan. 28, 2013, which is based on and claims priority to Japanese Patent Application No. JP 2012-085378, filed on Apr. 4, 2012. The disclosure of the Japanese priority application and the PCT application in their entirety, including the drawings, claims, and the specification thereof, are incorporated herein by reference.

FIELD OF THE INVENTION

Embodiments of the invention relate to an alarm signal generator circuit and alarm signal generation method, and in particular, with regard to an alarm output from an Intelligent Power Module (IPM), relates to a circuit and alarm signal generation method such as to generate an alarm signal for determining a phase in which a failure has occurred and the type of failure.

BACKGROUND ART

An IPM is an intelligent power device wherein a driver integrated circuit (IC) further incorporating drive and protection functions is installed in a module in which is mounted an Insulated Gate Bipolar Transistor (IGBT) chip or Free Wheeling Diode (FWD) chip. A driver IC installed in an IPM has functions of detecting the temperature of the IGBT chip and current flowing through the IGBT chip. When the detected temperature value of the IGBT chip exceeds a predetermined value, the driver IC detects the value as an overheat. Also, when the current flowing through the IGBT chip exceeds a predetermined value, the driver IC detects the current as an overcurrent. The driver IC outputs an alarm when detecting an overheat or overcurrent.

For example, technology whereby signals differing in accordance with the type of problem are transmitted to a control circuit so that the importance of a failure is understood is described in Japanese patent document No. JP-A-2003-88093 ("JP-A-2003-88093"). That is, the technology described in JP-A-2003-88093 is such that a pulse generator that generates a pulse of 1 ms width as a signal indicating a serious failure and a pulse generator that generates a pulse of 2 ms width as a signal indicating a minor failure are provided, and signals differing in accordance with the type of problem are transmitted to a control circuit so that the importance of a failure is understood.

Also, in Japanese patent document No. JP-A-5-30771 ("JP-A-5-30771"), it is described that, after an overcurrent is detected, diagnostic signals are applied sequentially to each switching element, it is determined that there is destruction of a switching element forming a pair in the same arm as that when the overcurrent is detected, a drive signal for causing a direct current braking current to flow is applied to the switching element and to a switching element in another arm connected to a bus bar of a voltage the reverse of that to which the switching element is connected, and direct current braking is carried out.

Furthermore, an overcurrent detector circuit that detects an overcurrent, a failed phase detector circuit that detects a failed phase, distinguishing between a failed phase and a sound phase, supplying a direct current to a motor by controlling the arm of the sound phase so as to be turned on and off, and stopping the motor by applying the direct current, are described in Japanese patent document No. JP-A-8-149868 ("JP-A-8-149868").

However, when the driver IC of an IGBT or MOS gate power element is provided inside an IPM, it may be that only one pad for outputting an alarm signal is provided in order to prevent a rise in cost accompanying an increase in chip size. In this kind of case, it is possible to determine that a failure has occurred by an alarm signal being output. However, even though it can be determined that a failure has occurred, it is not possible to determine in which phase the failure has occurred.

In order to determine in which phase a failure has occurred, it is conceivable that a pad be provided individually in each phase. In this case, however, there is a problem in that the chip size increases, leading to a rise in cost. This chip size-related problem cannot be resolved by the technology described in JP-A-2003-88093, JP-A-5-30771, and JP-A-8-149868.

SUMMARY OF INVENTION

Embodiments of the invention provide an alarm signal generator circuit and alarm signal generation method such that the type of failure that has occurred, and the phase in which the failure has occurred, can be determined from a pulse number and pulse width.

An alarm signal generator circuit according to one aspect of the invention is characterized by including, with regard to an instrument wherein a plurality of phase operations are carried out, a determination unit that determines a type of failure or a phase in which a failure has occurred, and an alarm signal generation unit that, in accordance with the result of the determination by the determination unit, generates an alarm signal including a pulse corresponding to the type of failure or to the phase among the plurality of phases in which the failure has occurred, wherein the failure details and the phase in which the failure has occurred can be determined from the alarm signal generated by the alarm signal generation unit. According to this kind of configuration, using a configuration wherein an alarm signal having a pulse number corresponding to the phase in which a failure has occurred is generated, or a configuration wherein an alarm signal having a pulse width corresponding to the phase in which a failure has occurred is generated, the type of failure that has occurred and the phase in which the failure has occurred can be determined from the pulse number and pulse width.

Also, the alarm signal generator circuit may further include a single terminal for deriving the alarm signal generated by the alarm signal generation unit, wherein the failure details and the phase in which the failure has occurred can be determined from the alarm signal derived from the single terminal. According to this kind of configuration, the type of failure and phase in which the failure has occurred can be determined in a device or circuit that has an alarm signal derived from a single terminal as an input.

Furthermore, the determination unit may include a latch circuit with a signal output from the instrument as an input, and a monostable multivibrator that outputs a pulse of a width corresponding to a type of failure based on the transition timing of the output of the latch circuit. According to this kind of configuration, a pulse of a width corresponding to the phase in which the failure has occurred can be generated, and the phase in which the failure has occurred can be determined.

The alarm signal generation unit may further include a counter that outputs a pulse of a number corresponding to the phase among the plurality of phases in which the failure has occurred. Using the counter, a pulse of a number corresponding to the phase in which the failure has occurred can be generated, and the phase in which the failure has occurred can be determined.

The alarm signal generation unit may further include a monostable multivibrator that outputs a pulse of a width corresponding to the phase among the plurality of phases in which the failure has occurred. Using the monostable multivibrator, a pulse of a width corresponding to the phase in which the failure has occurred can be generated, and the phase in which the failure has occurred can be determined.

An alarm signal generation method according to an embodiment may include, with regard to an instrument wherein a plurality of phase operations are carried out, a first step of a determination unit determining a type of failure or a phase in which a failure has occurred, and a second step of an alarm signal generation unit, in accordance with the result of the determination in the first step, generating an alarm signal including a pulse corresponding to the type of failure or to the phase among the plurality of phases in which the failure has occurred, wherein the failure details and the phase in which the failure has occurred can be determined from the alarm signal generated in the second step. According to the method, by generating an alarm signal having a pulse number corresponding to the phase in which a failure has occurred, or generating an alarm signal having a pulse width corresponding to the phase in which a failure has occurred, the type of failure that has occurred and the phase in which the failure has occurred can be determined from the pulse number and pulse width.

Using a configuration wherein an alarm signal having a pulse number corresponding to the phase in which a failure has occurred is generated, or a configuration wherein an alarm signal having a pulse width corresponding to the phase in which a failure has occurred is generated, the type of failure that has occurred and the phase in which the failure has occurred can be determined from the pulse number and pulse width. Because of this, the type of failure and phase in which the failure has occurred can be determined in a device or circuit that has an alarm signal derived from a single terminal as an input.

DESCRIPTION OF ILLUSTRATED EMBODIMENTS

Figure 1:
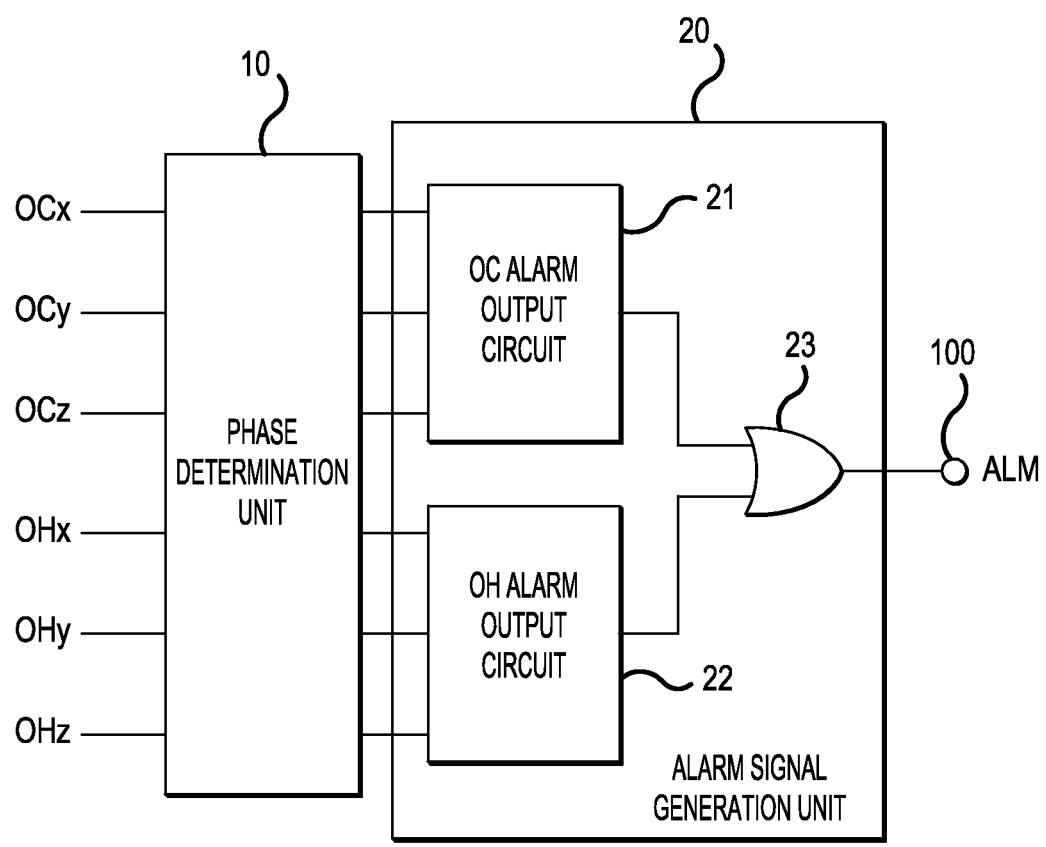
FIG. 1 is a diagram showing an example of a configuration of an alarm signal generator circuit according to a first embodiment of the invention.

Hereafter, referring to the drawings, a description will be given of embodiments of the invention. In each drawing referred to in the following description, portions the same as in another drawing are shown with the same reference signs.

Types of Failure

Herein, a description will be given of a case in which the monitoring target instrument is an IPM. As the types of failure that occur in an IPM, there are an overheat ("OH") failure, an overcurrent ("OC") failure, an undervoltage ("UV") failure, and the like. Further, when these failures occur, an alarm signal is output from a single terminal.

The invention is such that the phase in which a failure occurs can be determined from a pulse number or pulse width included in an alarm signal. That is, the heretofore known problem is resolved by a configuration that generates an alarm signal having a pulse number corresponding to the phase in which a failure has occurred or a configuration that generates an alarm signal having a pulse width corresponding to the phase in which a failure has occurred. In the specification, "failure" indicates a state wherein some kind of problem occurs, and a normal operation cannot be carried out. This includes, as well as a case in which this state is continuous, a case in which the state occurs intermittently.

First Embodiment

In a first embodiment, an alarm signal including a pulse width corresponding to the type of failure, and including a pulse number corresponding to the phase in which the failure has occurred, is generated. The alarm signal is derived from a single terminal, and the type of failure and phase in which the failure has occurred are determined in a device or circuit which has the alarm signal as an input.

FIG. 1 is a diagram showing an example of a configuration of an alarm signal generator circuit of the first embodiment of the invention. In FIG. 1, the alarm signal generator circuit of the embodiment includes a phase determination unit 10, with alarm signals OCx, OCy, OCz, OHx, OHy, and OHz as inputs, that determines in which phase a failure has occurred, and an alarm signal generation unit 20, with a determination signal from the phase determination unit 10 as an input, that generates an alarm signal. The output of the alarm signal generation unit 20 is derived from a single terminal 100.

The alarm signal OCx is a signal indicating that an overcurrent (OC) failure has occurred in an x phase. The alarm signal OCy, in the same way, is a signal indicating that an OC failure has occurred in a y phase. The alarm signal OCz, in the same way, is a signal indicating that an OC failure has occurred in a z phase.

The alarm signal OHx is a signal indicating that an overheat (OH) failure has occurred in the x phase. The alarm signal OHy, in the same way, Is a signal indicating that an OH failure has occurred in the y phase. The alarm signal OHz, in the same way, is a signal indicating that an OH failure has occurred in the z phase.

Figure 2:
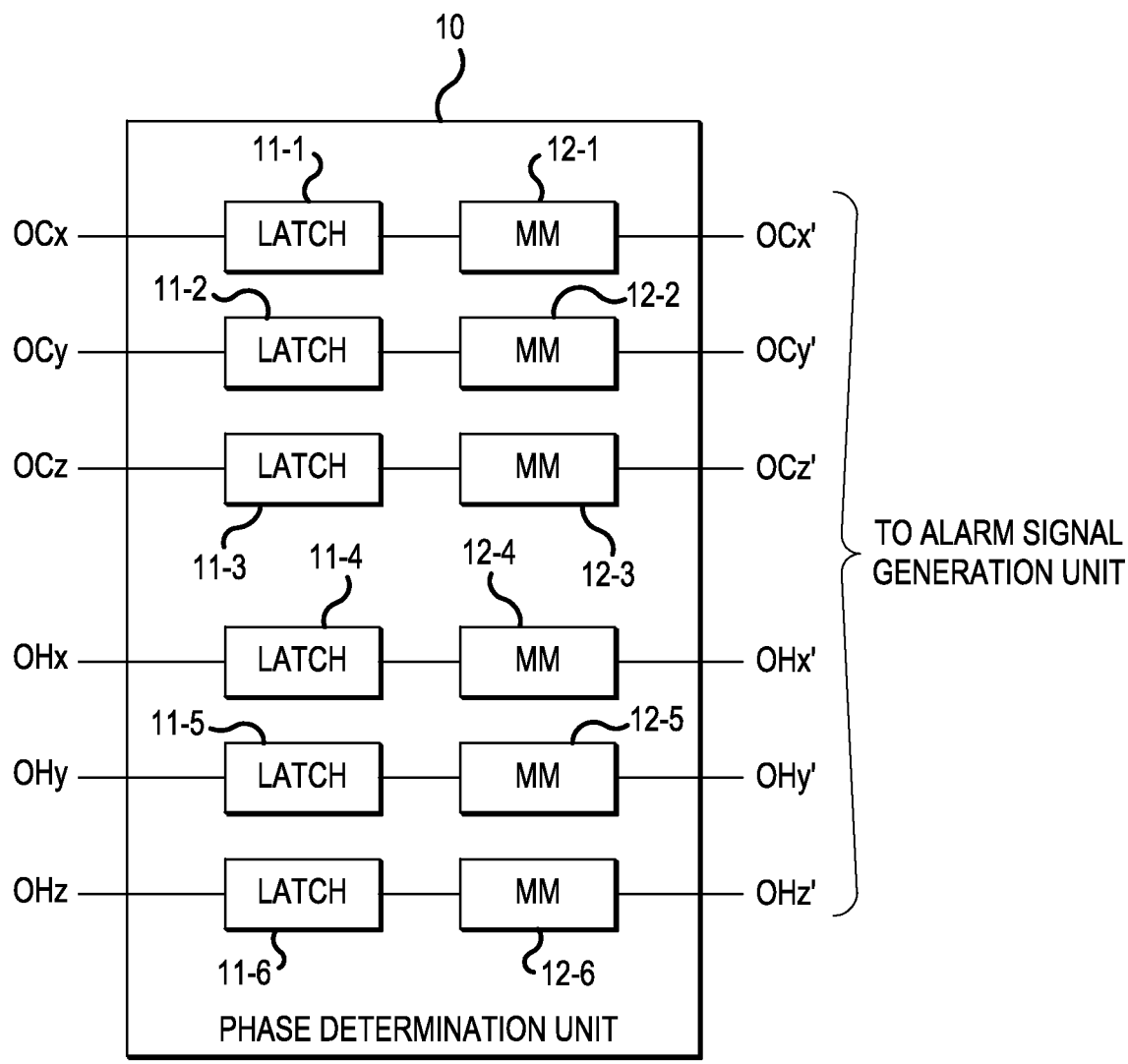
FIG. 2 is a diagram showing an example of a configuration of a phase determination unit in FIG. 1.

The phase determination unit 10 with these alarm signals as inputs is configured as in, for example, FIG. 2. In FIG. 2, the phase determination unit 10 includes latch circuits 11-1, 11-2, 11-3, 11-4, 11-5, and 11-6, provided corresponding one each to the alarm signals OCx, OCy, OCz. OHx, OHy, and OHz, and monostable multivibrators (shown in the drawing as "MM") 12-1, 12-2, 12-3, 12-4, 12-5, and 12-6, provided corresponding one each to the latch circuits. The latch circuits 11-1 to 11-6 have a function of, when the corresponding alarm signal is input, holding a logic level of the alarm signal.

The monostable multivibrators 12-1 to 12-6 have time constants that differ for each type of failure, and output pulses of widths corresponding to the types of failure, and differing for each type of failure, based on the transition timing of the outputs of the latch circuits 11-1 to 11-6. In the example, the monostable multivibrators (hereafter abbreviated to mono multivibrators as appropriate) 12-1, 12-2, and 12-3 corresponding to the alarm signals OCx, OCy, and OCz that indicate an OC failure, and the mono multivibrators 12-4, 12-5, and 12-6 corresponding to the alarm signals OHx, OHy, and OHz that indicate an OH failure, output pulses of mutually different pulse widths. In the example, assuming the pulse width of the alarm signals OCx, OCy, and OCz that indicate an OC failure to be Po, and the pulse width of the alarm signals OHx, OHy, and OHz that indicate an OH failure to be Ph, the relationship between the sizes of the pulse widths is Po<Ph. The outputs of the monostable multivibrators 12-1 to 12-6 are input into the alarm signal generation unit.

Returning to FIGS. 1 and 2, alarm signals OCx', OCy', and OCz' having a pulse width corresponding to the type of failure are input into an OC alarm output circuit 21 in the alarm signal generation unit 20. Also, alarm signals OHx', OHy', and OHz' having a pulse width corresponding to the type of failure are input into an OH alarm output circuit 22 in the alarm signal generation unit 20.

Figure 3:
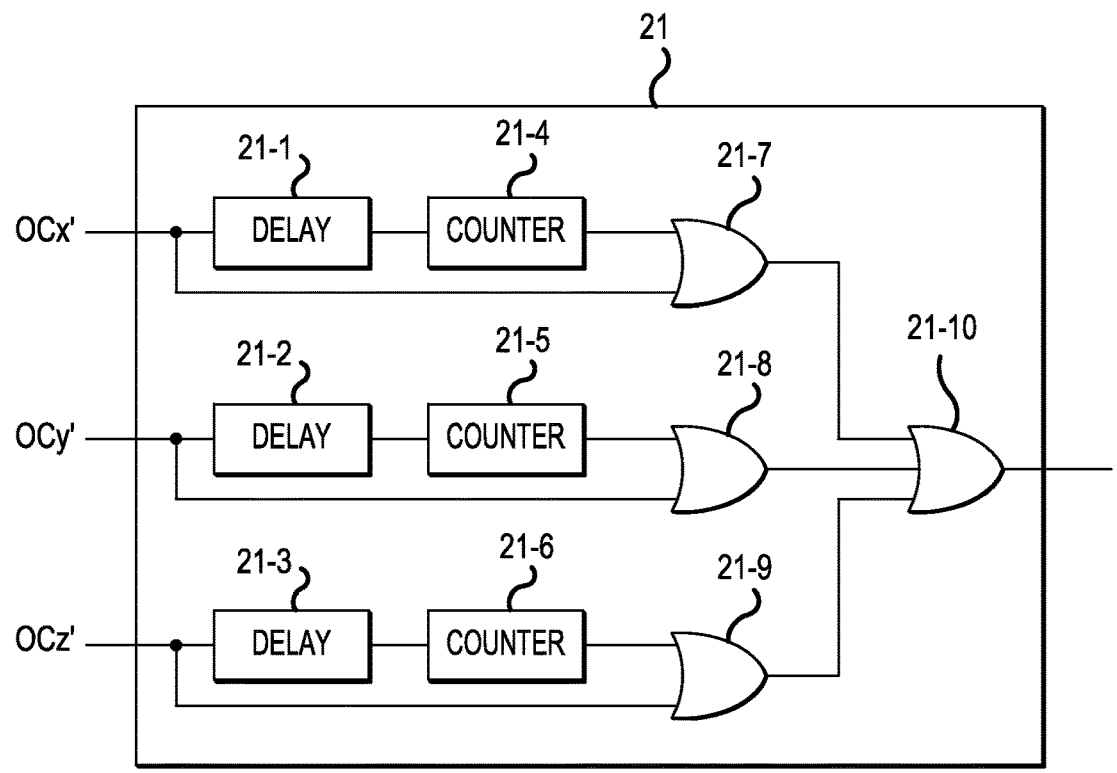
FIG. 3 is a diagram showing an example of a configuration of an OC alarm output circuit in FIG. 1.

The OC alarm output circuit 21 is configured as in, for example, FIG. 3. In FIG. 3, the OC alarm output circuit 21 of the example includes delay circuits 21-1, 21-2, and 21-3 provided corresponding respectively to the alarm signals OCx', OCy', and OCz' having pulse widths that differ for each type of failure, counters 21-4, 21-5, and 21-6 provided corresponding respectively to the alarm signals OCx', OCy', and OCz', OR gates 21-7, 21-8, and 21-9 that calculate a logical sum of pulses output from the counters 21-4, 21-5, and 21-6 and the corresponding alarm signals OCx', OCy', and OCz', and output the logical sum, and an OR gate 21-10 that calculates a logical sum of the outputs of the OR gates 21-7, 21-8, and 21-9, and outputs the logical sum.

The delay circuits 21-1, 21-2, and 21-3 delay the corresponding alarm signals OCx', OCy', and OCz' by a predetermined time, and output the alarm signals OCx', OCy', and OCz'. Assuming the times delayed by the delay circuits 21-1, 21-2, and 21-3 to be the same, the time is assumed to be greater than a time corresponding to the maximum width of pulse widths differing for each type of failure, to be described hereafter The counters 21-4, 21-5, and 21-6, when the corresponding alarm signals OCx', OCy', and OCz' are input, output pulses of mutually different numbers. That is, the counters 21-4, 21-5, and 21-6 output a pulse of a number corresponding to the phase. In the example, it is assumed that the pulse number corresponding to the alarm signal OCx' is "1", the pulse number corresponding to the alarm signal OCy' is "2", and the pulse number corresponding to the alarm signal OCz' is "3". Logical sums of the pulses output from the counters 21-4, 21-5, and 21-6 and the corresponding alarm signals OCx', OCy', and OCz' are calculated by the OR gates 21-7, 21-8, and 21-9, and the logical sums are output.

Figure 4:
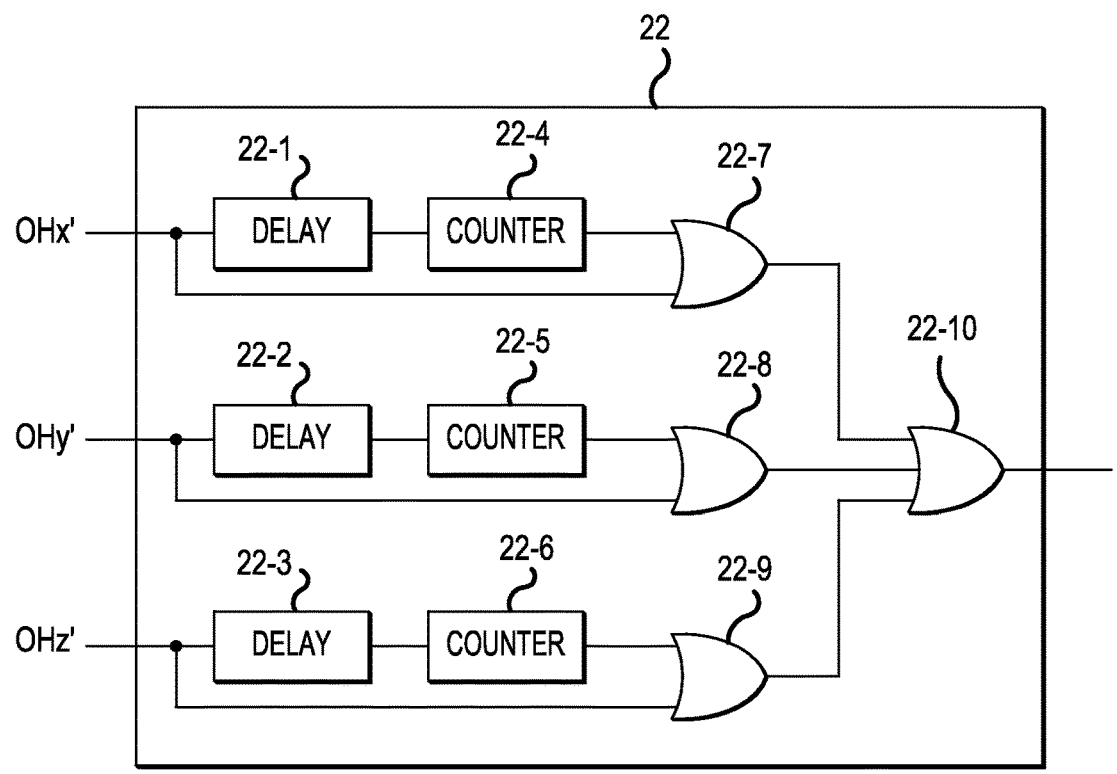
FIG. 4 is a diagram showing an example of a configuration of an OH alarm output circuit in FIG. 1.

Also, the OH alarm output circuit 22 is configured as in, for example, FIG. 4. In FIG. 4, the OH alarm output circuit 22 of the example includes delay circuits 22-1, 22-2, and 22-3 provided corresponding respectively to the alarm signals OHx', OHy', and OHz' having pulse widths that differ for each type of failure, counters 22-4, 22-5, and 22-6 provided corresponding respectively to the alarm signals OHx', OHy', and OHz', OR gates 22-7, 22-8, and 22-9 that calculate a logical sum of pulses output from the counters 22-4, 22-5, and 22-6 and the corresponding alarm signals OHx', OHy', and OHz', and output the logical sum, and an OR gate 22-10 that calculates a logical sum of the outputs of the OR gates 22-7, 22-8, and 22-9, and outputs the logical sum.

The delay circuits 22-1, 22-2, and 22-3 delay the corresponding alarm signals OHx', OHy', and OHz' by a predetermined time, and output the alarm signals OHx', OHy', and OHz'. Assuming the times delayed by the delay circuits 22-1, 22-2, and 22-3 to be the same, the time is assumed to be greater than a time corresponding to the maximum width of pulse widths differing for each type of failure, to be described hereafter.

The counters 22-4, 22-5, and 22-6, when the corresponding alarm signals OHx', OHy', and OHz' are input, output pulses of mutually different numbers (that is, a pulse of a number corresponding to the phase in which a failure has occurred). In the example, it is assumed that the pulse number corresponding to the alarm signal OHx' is "1", the pulse number corresponding to the alarm signal OHy' is "2", and the pulse number corresponding to the alarm signal OHz' is "3". Logical sums of the pulses output from the counters 22-4, 22-5, and 22-6 and the corresponding alarm signals OHx', OHy', and OHz' are calculated by the OR gates 22-7, 22-8, and 22-9, and the logical sums are output.

Figure 5:
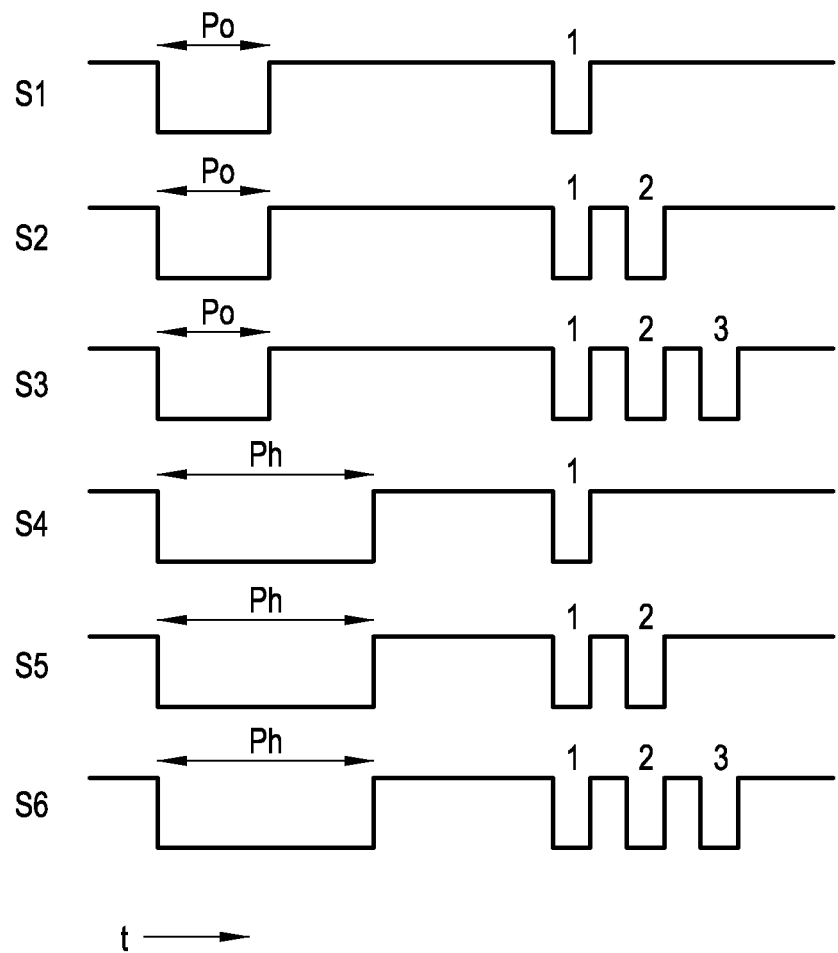
FIG. 5 is a diagram showing an example of an alarm signal according to the first embodiment of the invention.

Returning to FIG. 1, a logical sum of the output of the OC alarm output circuit 21 and the output of the OH alarm output circuit 22 is calculated by an OR gate 23, and forms an alarm signal ALM. Herein, referring to FIG. 5, a description will be given of an example of the alarm signal ALM derived according to the embodiment. In the example, as it is necessary to be able to determine, with regard to an OH failure and OC failure, the type of failure and in which phase (which of the three phases) the failure has occurred, six kinds of waveform S1 to S6 shown in FIG. 5 are generated for the alarm signal ALM. Herein, the relationship between the pulse width Po of an alarm signal indicating an OC failure and the pulse width Ph of an alarm signal indicating an OH failure is Po<Ph. Consequently, the type of failure can be determined from the pulse width of the first portion of the alarm signal waveform.

Furthermore, as shown in FIG. 5, the pulse number "1" when the phase in which the failure has occurred is the x phase, the pulse number "2" when the phase in which the failure has occurred is the y phase, and the pulse number "3" when the phase in which the failure has occurred is the z phase, are included in the alarm signal waveform. Consequently, the phase in which the failure has occurred can be determined from the pulse number.

As heretofore described, an alarm signal having a waveform corresponding to the type of failure and the phase in which the failure has occurred is generated, because of which the alarm signal output from the single terminal 100 is such that the type of failure can be determined from the pulse width, and the phase in which the failure has occurred can be determined from the pulse number.

Figure 6:
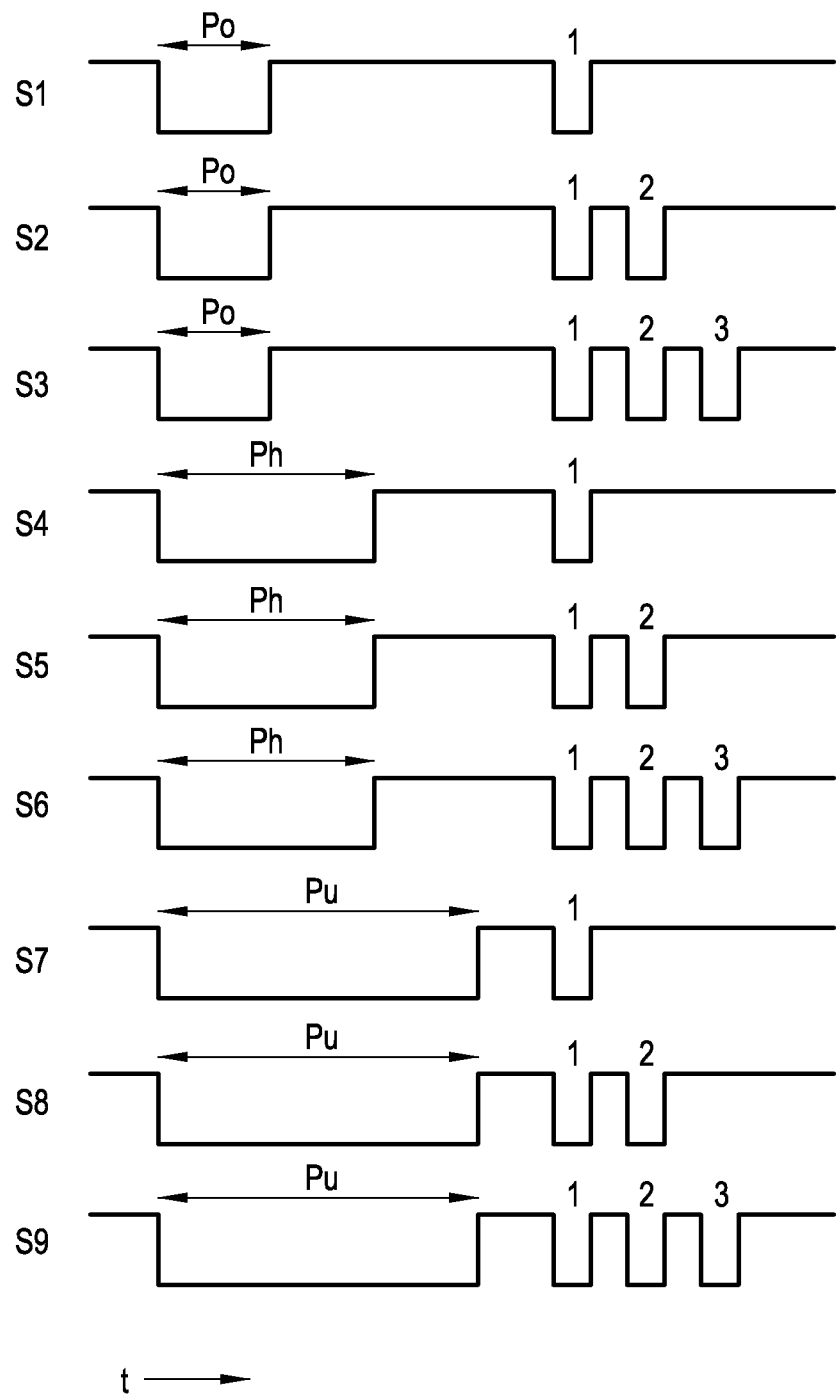
FIG. 6 is a diagram showing another example of the alarm signal according to the first embodiment of the invention.

Incidentally, the above is a description of a case wherein the type of failure and the phase (which of the three phases) in which the failure has occurred are determined with regard to an OH failure and OC failure, but when also determining, in addition to these, the phase in which the failure has occurred with regard to a UV failure, it is sufficient to add to the alarm output circuits described with reference to FIG. 3 and FIG. 4 to respond to a UV failure, and generate an alarm signal having a pulse width differing from that of the other failures. In order to determine the type of failure and the phase in which the failure has occurred with regard to an OH failure, an OC failure, and a UV failure, it is sufficient that nine kinds of alarm signal S1 to S9 are generated, as shown in FIG. 6. Herein, assuming the pulse width of the alarm signals that indicate an OC failure to be Po, the pulse width of the alarm signals that indicate an OH failure to be Ph, and the pulse width of alarm signals that indicate a UV failure to be Pu, the relationship between the sizes of the pulse widths is Po<Ph<Pu. Consequently, the type of failure can be determined from the pulse width of the first portion of the alarm signal waveform.

Furthermore, as shown in FIG. 6, the pulse number "1" when the phase in which the failure has occurred is the x phase, the pulse number "2" when the phase in which the failure has occurred is the y phase, and the pulse number "3" when the phase in which the failure has occurred is the z phase, are included in the alarm signal waveform. Consequently, the phase in which the failure has occurred can be determined from the pulse number.

Second Embodiment

In a second embodiment, an alarm signal including a pulse width corresponding to the type of failure, and including a pulse width corresponding to the phase in which the failure has occurred, is generated. The alarm signal is derived from a single terminal, and the type of failure and phase in which the failure has occurred are identified in a device or circuit which has the alarm signal as an input.

Figure 7:
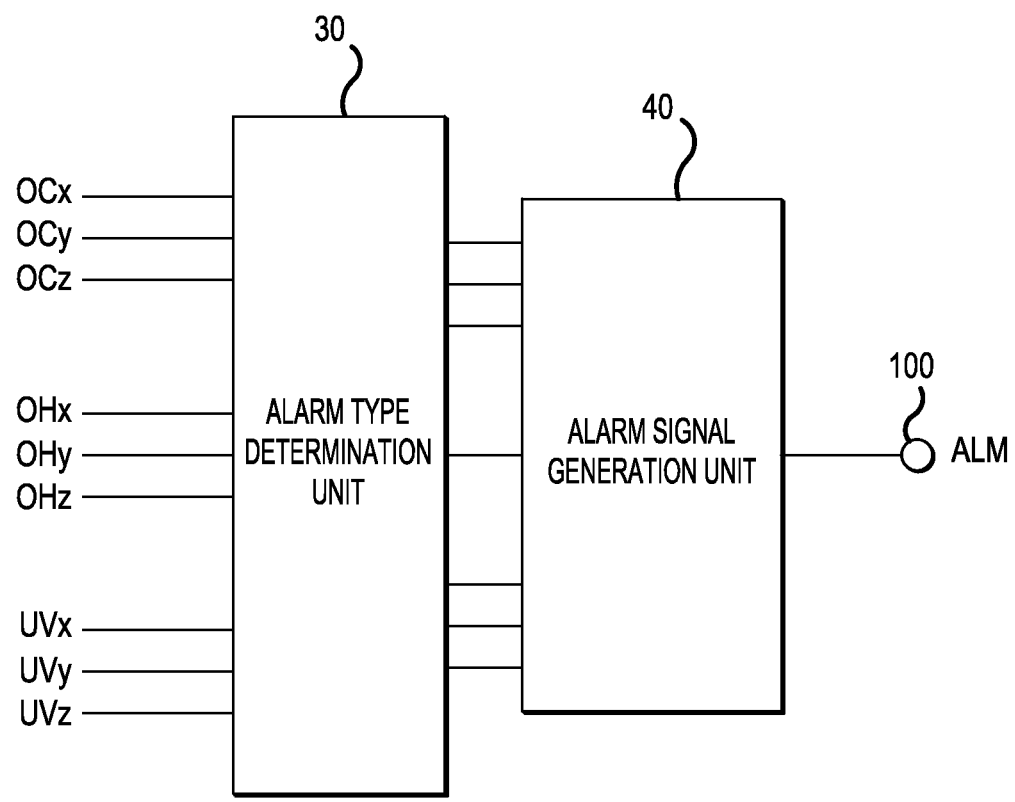
FIG. 7 is a diagram showing an example of a configuration of an alarm signal generator circuit according to a second embodiment of the invention.

FIG. 7 is a diagram showing an example of a configuration of an alarm signal generator circuit of the second embodiment of the invention. In FIG. 7, the alarm signal generator circuit of the embodiment includes an alarm type determination unit 30, with alarm signals OCx, OCy, OCz, OHx, OHy, OHz, UVx, UVy, and UVz as inputs, that determines the type of failure, and an alarm signal generation unit 40, with a determination signal from the alarm type determination unit 30 as an input, that generates an alarm signal ALM.

The alarm signal OCx is a signal indicating that an overcurrent (OC) failure has occurred in the x phase. The alarm signal OCy, in the same way, is a signal indicating that an OC failure has occurred in the y phase. The alarm signal OCz, in the same way, is a signal indicating that an OC failure has occurred in the z phase.

The alarm signal OHx is a signal indicating that an overheat (OH) failure has occurred in the x phase. The alarm signal OHy, in the same way, is a signal indicating that an OH failure has occurred in the y phase. The alarm signal OHz, in the same way, is a signal indicating that an OH failure has occurred in the z phase.

The alarm signal UVx is a signal indicating that an undervoltage (UV) failure has occurred in the x phase. The alarm signal UVy, in the same way, is a signal indicating that a UV failure has occurred in the y phase. The alarm signal UVz, in the same way, is a signal indicating that a UV failure has occurred in the z phase.

Figure 8:
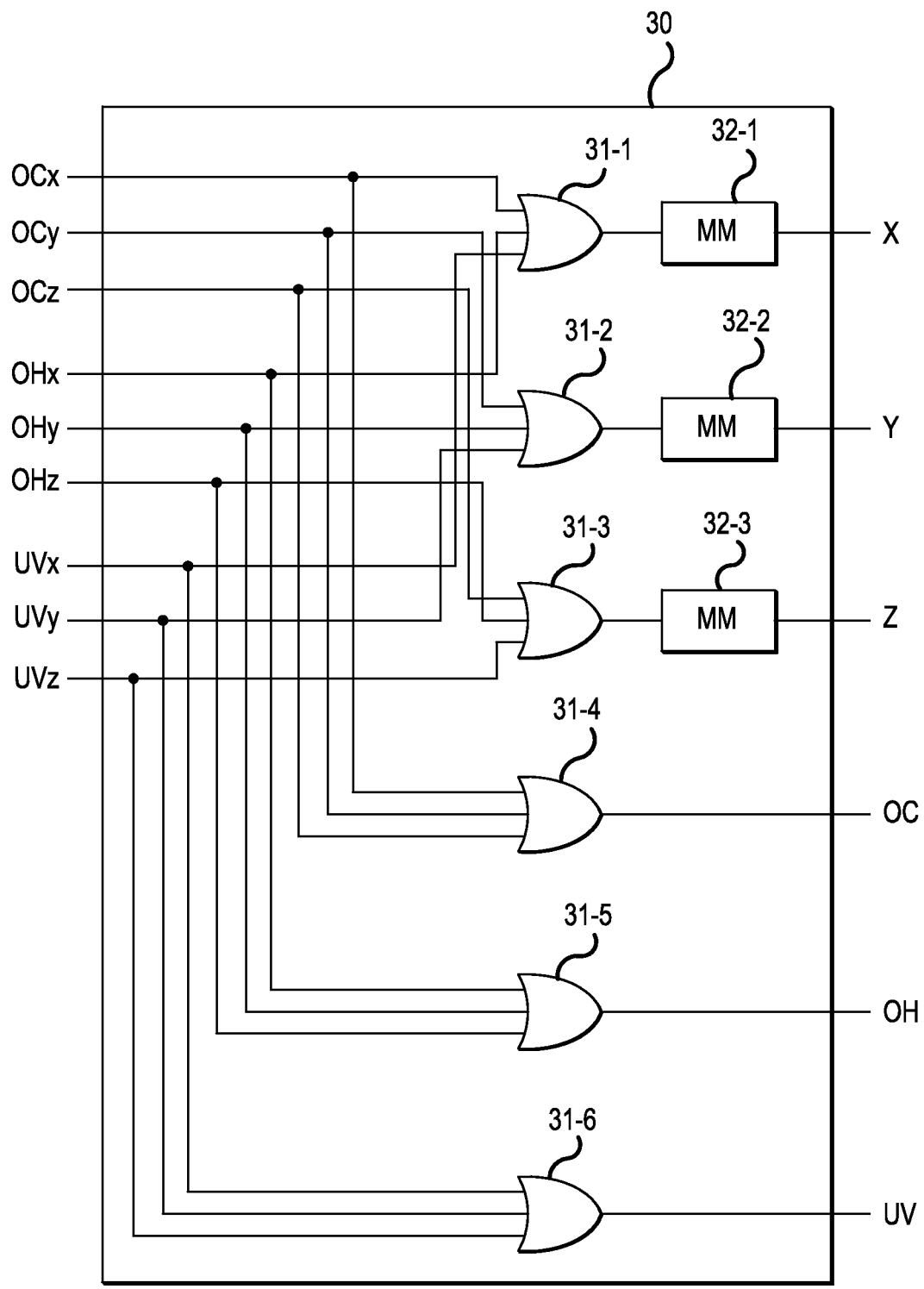
FIG. 8 is a diagram showing an example of a configuration of an alarm type determination unit in FIG. 7.

The alarm type determination unit 30 with these alarm signals as inputs is configured as in, for example, FIG. 8. In FIG. 8, the alarm type determination unit 30 includes OR gates 31-1, 31-2, and 31-3, which carry out a logical sum processing of the alarm signals for each phase and output the logical sum, mono multivibrators 32-1, 32-2, and 32-3 provided corresponding to each phase, and OR gates 31-4, 31-5, and 31-6, which calculate a logical sum of the alarm signals for each type of failure and output the logical sum.

The mono multivibrators 32-1, 32-2, and 32-3 are provided corresponding to each phase and, based on the transition timing of the output of the corresponding OR gate, output signals X, Y, and Z having pulses of pulse widths corresponding to each phase. In the example, assuming the pulse width of the signal X corresponding to the x phase to be Px, the pulse width of the signal Y corresponding to the y phase to be Py, and the pulse width of the signal Z corresponding to the z phase to be Pz, the relationship between the sizes of the pulse widths in the example is Px<Py<Pz. That is, the signal X, signal Y, and signal Z are signals having pulse widths corresponding to each phase.

The signal X, signal Y, and signal Z, which are the outputs of the mono multivibrators 32-1, 32-2, and 32-3, and an alarm signal OC indicating an OC failure, an alarm signal OH indicating an OH failure, and an alarm signal UV indicating a UV failure, which are the outputs of the OR gates 31-4, 31-5, and 31-6, are input into the alarm signal generation unit 40.

Figure 9:
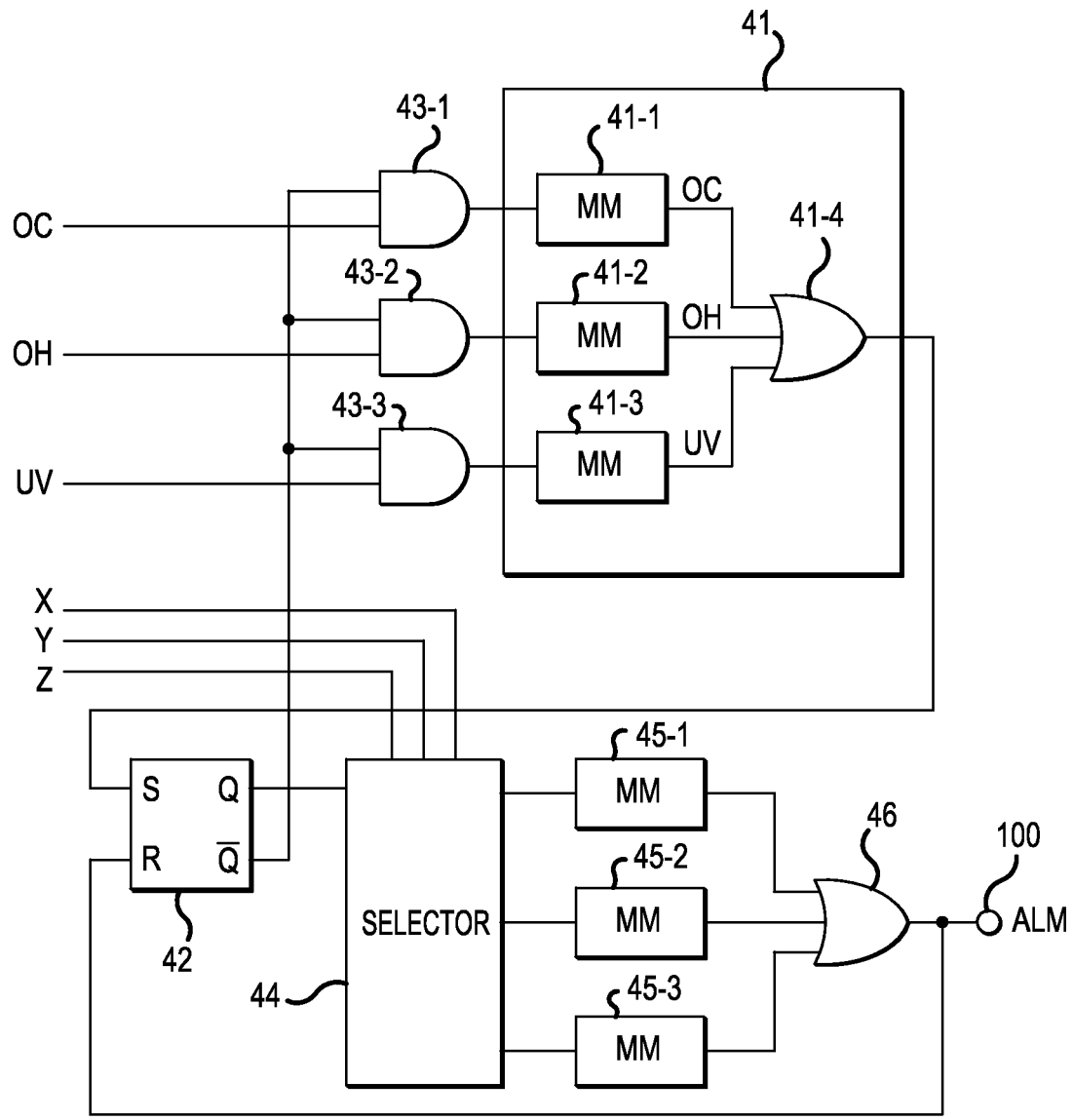
FIG. 9 is a diagram showing an example of a configuration of an alarm signal generation unit in FIG. 7.

The alarm signal generation unit 40 in FIG. 7 is configured as in, for example, FIG. 9. Referring to FIG. 9, the alarm signal generation unit 40 has an alarm type pulse generator circuit 41 into which the alarm signal OC indicating an OC failure, the alarm signal OH indicating an OH failure, and the alarm signal UV indicating a UV failure are input via AND gates 43-1, 43-2, and 43-3. Also, the alarm signal generation unit 40 has a reset/set flip-flop ("RSFF") 42 into a set terminal ("S terminal") of which is input the output of the alarm type pulse generator circuit 41, a selector 44 with the output from a Q terminal of the RSFF 42 as an input, mono multivibrators 45-1, 45-2, and 45-3 with an output of the selector 44 as an input, and an OR gate 46 that calculates a logical sum of the outputs of the mono multivibrators 45-1, 45-2, and 45-3, and outputs the logical sum.

The alarm type pulse generator circuit 41 has mono multivibrators 41-1, 41-2, and 41-3, and an OR gate 41-4 that calculates a logical sum of the outputs of the mono multivibrators 41-1, 41-2, and 41-3, and outputs the logical sum. The mono multivibrators 41-1, 41-2, and 41-3 output signals of a pulse width corresponding to a type of failure. In the example, the mono multivibrator 41-1 outputs the signal OC having a pulse width corresponding to an OC failure, the mono multivibrator 41-2 outputs the signal OH having a pulse width corresponding to an OH failure, and the mono multivibrator 41-3 outputs the signal UV having a pulse width corresponding to a UV failure.

This kind of configuration is such that the RSFF 42 is set by signals having pulse widths corresponding to a type of failure output from the mono multivibrators 41-1, 41-2, and 41-3. An output of the RSFF 42 is input by the selector 44 into one of the mono multivibrators 45-1, 45-2, and 45-3. The mono multivibrators 45-1, 45-2, and 45-3 are provided corresponding to the signal X, signal Y, and signal Z respectively and, in the example, output pulses of widths corresponding to each phase based on the timing of the fall of the corresponding signal.

A logical sum of the outputs of the mono multivibrators 45-1, 45-2, and 45-3 is calculated by the OR gate 46, and output from the single terminal 100 as the signal ALM. Also, as the output of the OR gate 46 is applied to a reset R terminal of the RSFF 42, the RSFF 42 attains a reset state owing to the output of the OR gate 46. Because of this, an output from an inversion Q terminal of the RSFF 42 returns to the original state.

The output from the inversion Q terminal of the RSFF 42 forms one input of each of the two-input AND gates 43-1, 43-2, and 43-3. Because of this, when the output of the alarm type pulse generator circuit 41 is input into the set S terminal of the RSFF 42, the output state of the RSFF 42 is maintained, whatever the other input of the AND gates 43-1, 43-2, and 43-3. That is, the alarm signal among the alarm signals OC, OH, and UV that rises earliest is given priority, and the RSFF 42 is not put into a set state by another signal. Because of this, even when a plurality of alarm signals rise around the same time, those not given priority are not received, and it does not happen that alarm signals coincide. Because of this, it is possible to reliably determine the type of failure, and the phase in which the failure has occurred, from the pulse width.

Figure 10:
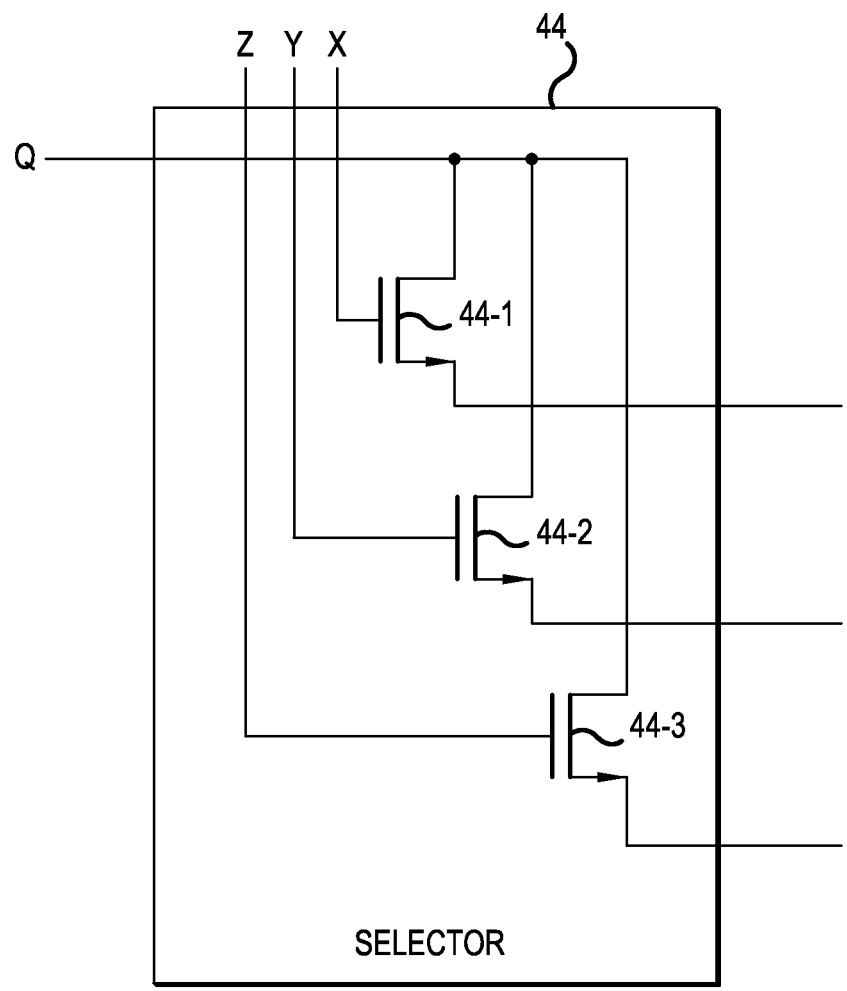
FIG. 10 is a diagram showing an example of a configuration of a selector in FIG. 9.

Herein, the selector 44 in FIG. 9 is configured as in, for example, FIG. 10. In FIG. 10, the selector 44 of the example includes a MOS transistor 44-1 to whose gate terminal the signal X is applied, a MOS transistor 44-2 to whose gate terminal the signal Y is applied, and a MOS transistor 44-3 to whose gate terminal the signal Z is applied. The output from the Q terminal of the RSFF 42 is applied to the source terminals of the MOS transistors 44-1, 44-2, and 44-3. As the selector 44 is of this kind of configuration, signals of pulse widths corresponding to each phase are input into the corresponding mono multivibrators 45-1 to 45-3. That is, signals including a pulse width Px of the signal X corresponding to the x phase, a pulse width Py of the signal Y corresponding to the y phase, and a pulse width Pz of the signal Z corresponding to the z phase are input into the mono multivibrators 45-1, 45-2, and 45-3.

Herein, referring to FIG. 11, a description will be given of examples of the alarm signal ALM derived according to the embodiment.

Figure 11:
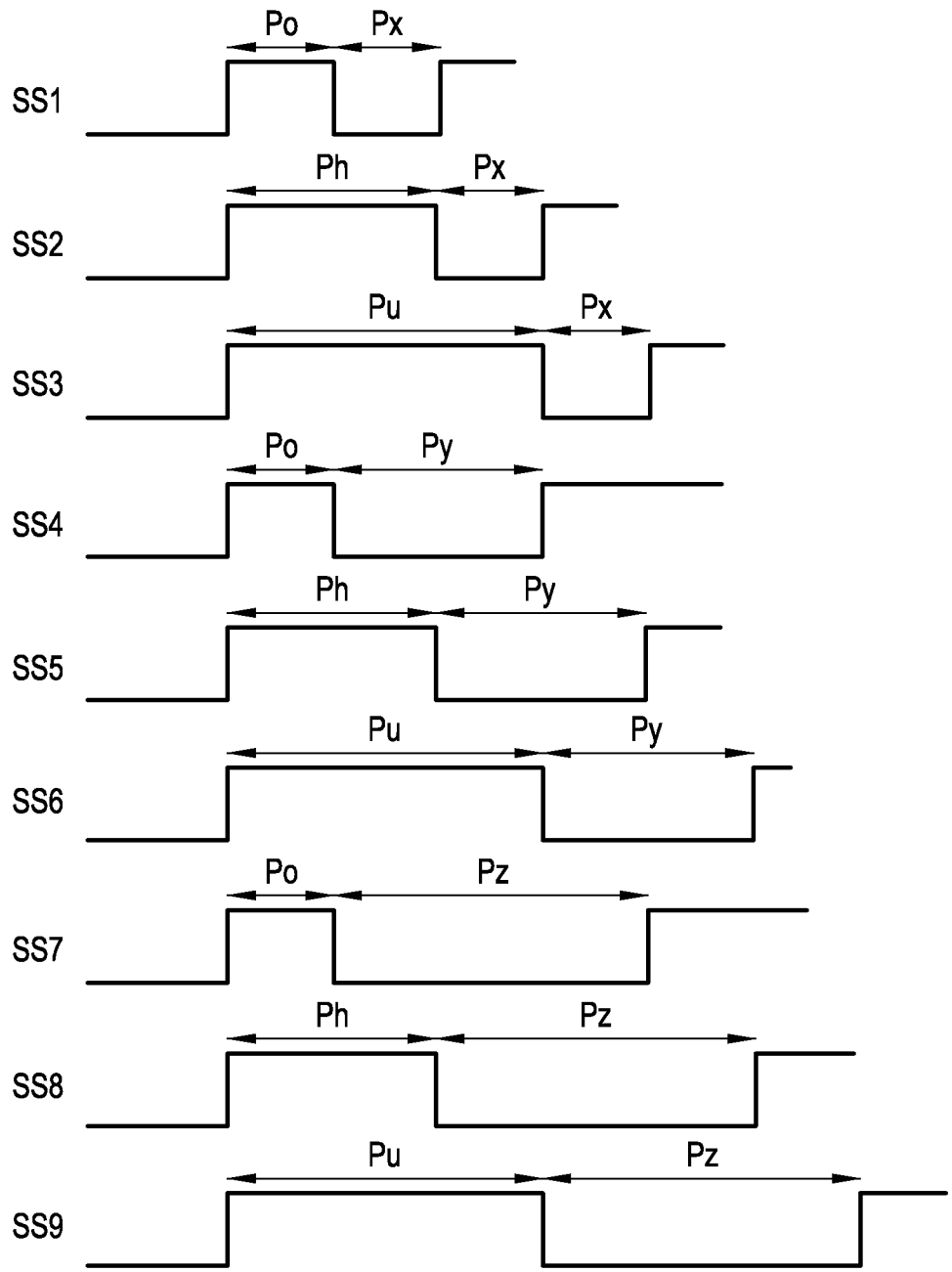
FIG. 11 is a diagram showing an example of an alarm signal according to the second embodiment of the invention.

In order to determine the type of failure and the phase in which the failure has occurred with regard to an OH failure, OC failure, and UV failure, it is sufficient that nine types of alarm signal SS1 to SS9 are generated, as shown in FIG. 11. Herein, assuming the pulse width of alarm signals that indicate an OC failure to be Po, the pulse width of alarm signals that indicate an OH failure to be Ph, and the pulse width of alarm signals that indicate a UV failure to be Pu, the relationship between the sizes of the pulse widths is Po<Ph<Pu. Consequently, the type of failure can be determined from the pulse width of the first rise portion of the alarm signal waveform.

Furthermore, in the example, assuming the pulse width of alarm signals that indicate a failure in the x phase to be Px, the pulse width of alarm signals that indicate a failure in the y phase to be Py, and the pulse width of alarm signals that indicate a failure in the z phase to be Pz, the relationship between the sizes of the pulse widths is Px<Py<Pz. Consequently, the phase in which the failure has occurred can be determined from the pulse width in a low-level period of the first or subsequent fall portion of the alarm signal waveform.

(Pulse Width or Pulse Number Determination)

The pulse width and pulse number in the first embodiment, and the pulse widths in the second embodiment, can be determined by, for example, sampling each signal using a clock with a repetition period sufficiently shorter than that of each signal described with reference to FIGS. 5 and 6 and FIG. 11. Because of this, the type of failure and the phase in which the failure has occurred can be determined.

(IC Chip Fabrication)

The alarm signal generator circuit of the first embodiment and the alarm signal generator circuit of the second embodiment are both such that a significant advantage is obtained by mounting on an IC chip. That is, it is necessary to suppress an increase in the number of pins in order to reduce the cost of an IC chip, and according to the heretofore described alarm signal generator circuits, the type of failure and the phase in which the failure has occurred can be determined from an alarm signal derived from a single terminal.

(Alarm Signal Generation Method)

An alarm signal generation method is realized in the following way in the alarm signal generator circuit of the first embodiment and the alarm signal generator circuit of the second embodiment. That is, with regard to an instrument wherein a plurality of phase operations are carried out, there is realized an alarm signal generation method including a first step of the determination unit determining the type of failure or the phase in which the failure has occurred, and a second step of the alarm signal generation unit, in accordance with the result of the determination of the first step, generating an alarm signal including a pulse corresponding to the type of failure or to the phase among the heretofore described plurality of phases in which the failure has occurred, wherein the failure details and the phase in which the failure has occurred can be determined from the alarm signal generated in the second step.

According to the method, by an alarm signal having a pulse number corresponding to the phase in which a failure has occurred being generated, or by an alarm signal having a pulse width corresponding to the phase in which a failure has occurred being generated, the type of failure that has occurred and the phase in which the failure has occurred can be determined from the pulse number and pulse width.

Modification Example

Heretofore, a description has been given of a case wherein the target of failure detection is an IPM having a 3-phase output, but it is clear that, not being limited to three phases, the invention is applicable provided that there are a plurality of phases (two or more phases). Also, not being limited to a case wherein a driver IC of an IGBT or MOS gate power element is provided inside an IPM, it is clear that the invention is also applicable when the driver IC is provided on the exterior of the module, and an alarm signal is output from a single terminal.

As heretofore described, using a configuration wherein an alarm signal having a pulse number corresponding to the phase in which a failure has occurred is generated, or a configuration wherein an alarm signal having a pulse width corresponding to the phase in which a failure has occurred is generated, the phase in which a failure has occurred can be determined from the pulse number or pulse width. Because of this, the type of failure and the phase in which the failure has occurred can be determined in a device or circuit with an alarm signal derived from a single terminal as an input.

The scope of the invention, not being limited to the exemplifying embodiments shown in the drawings, also includes all embodiments providing an advantage equivalent to that which the invention has as an object. Furthermore, the scope of the invention, not being limited to the combinations of characteristics of the invention defined by the claims, may be defined by any desired combination of specific characteristics among all disclosed characteristics.

What is claimed is:

1. An alarm signal generator circuit to generate a signal indicative of a failure of an instrument that carries out a plurality of phase operations, the alarm signal generator circuit comprising:
   a determination unit configured to determine a type of failure of the instrument that has occurred and to output a signal having a pulse width indicating the type of failure; and
   an alarm signal generation unit that includes a delay circuit and that is configured to (i) receive the signal having the pulse width indicating the type of failure from the determination unit, (ii) delay the received signal having the pulse width indicating the type of failure by using the delay circuit that has a delay time that at least exceeds a time corresponding to the pulse width indicating the type of failure, and (iii) generate an alarm signal using the delayed signal indicating the type of failure,
   wherein the type of failure and a phase among a plurality of phases in which the failure has occurred can be determined from the alarm signal generated by the alarm signal generation unit using the delayed signal indicating the type of failure, the alarm signal including a first portion that occurs during a first portion of time of the alarm signal and a second portion that occurs during a second portion of time of the alarm signal different from the first portion of time, the first portion of the alarm signal being determinative of the type of failure that has occurred and the second portion of the alarm signal being determinative of the phase in which the failure has occurred.

2. The alarm signal generator circuit according to claim 1, further comprising:
   a single terminal for deriving the alarm signal generated by the alarm signal generation unit,
   wherein the type of failure and the phase in which the failure has occurred can be determined from the alarm signal derived from the single terminal.

3. The alarm signal generator circuit according to claim 1, wherein the determination unit comprises:
   a latch circuit configured to receive a signal output from the instrument; and
   a monostable multivibrator configured to output a pulse of a width corresponding to the type of failure based on the transition timing of the output of the latch circuit.

4. The alarm signal generator circuit according to claim 1, wherein the alarm signal generation unit further comprises a counter configured to receive the delayed signal indicating the type of failure and output a pulse of a number corresponding to the phase among the plurality of phases in which the failure has occurred.

5. An alarm signal generation method for generating a signal indicative of a failure of an instrument that carries out a plurality of phase operations, the method comprising:
   determining a type of failure of the instrument that has occurred and outputting a signal having a pulse width indicating the type of failure; and
   receiving the signal having the pulse width indicating the type of failure, delaying the received signal having the pulse width indicating the type of failure for a predetermined amount of time that at least exceeds a time corresponding to the pulse width indicating the type of failure, and generating an alarm signal using the delayed signal indicating the type of failure,
   wherein the type of failure and a phase among a plurality of phases in which the failure has occurred can be determined from the alarm signal generated using the delayed signal indicating the type of failure, the alarm signal including a first portion that occurs during a first portion of time of the alarm signal and a second portion that occurs during a second portion of time of the alarm signal different from the first portion of time, the first portion of the alarm signal being determinative of the type of failure that has occurred and the second portion being determinative of the phase in which the failure has occurred.

6. The alarm signal generator circuit according to claim 2, wherein the determination unit comprises:
   a latch circuit configured to receive a signal output from the instrument; and
   a monostable multivibrator configured to output a pulse of a width corresponding to the type of failure based on the transition timing of the output of the latch circuit.

7. The alarm signal generator circuit according to claim 2, wherein the alarm signal generation unit further comprises a counter configured to receive the delayed signal indicating the type of failure and output a pulse of a number corresponding to the phase among the plurality of phases in which the failure has occurred.

8. The alarm signal generator circuit according to claim 3, wherein the alarm signal generation unit further comprises a counter configured to receive the delayed signal indicating the type of failure and output a pulse of a number corresponding to the phase among the plurality of phases in which the failure has occurred.

9. The alarm signal generator circuit according to claim 2, wherein the first portion of the alarm signal includes a pulse having a width that varies according to the type of failure that has occurred, and the second portion of the alarm signal includes a number of pulses that varies according to the phase in which the failure has occurred.

10. The alarm signal generator circuit according to claim 9, wherein the first portion of the alarm signal precedes the second portion of the alarm signal.

11. The alarm signal generator circuit according to claim 1, wherein the delay circuit of the alarm signal generation unit includes:
    a first delay circuit configured to receive a first signal having a first pulse width indicating a first type of failure from the determination unit and to delay the received first signal for a first predetermined amount of time that exceeds a time corresponding to the first pulse width, and
    a second delay circuit configured to receive a second signal having a second pulse width indicating a second type of failure from the determination unit and to delay the received second signal for a second predetermined amount of time that exceeds a time corresponding to the second pulse width, the second type of failure being different from the first type of failure.

12. The alarm signal generator circuit according to claim 11, wherein the delay circuit of the alarm signal generation unit further includes:

a third delay circuit configured to receive a third signal having the first pulse width indicating the first type of failure from the determination unit and to delay the received third signal for the first predetermined amount of time, and a fourth delay circuit configured to receive a fourth signal having the first pulse width indicating the first type of failure from the determination unit and to delay the received fourth signal for the first predetermined amount of time.

13. The alarm signal generator circuit according to claim 12, wherein the delay circuit of the alarm signal generation unit further includes:

a fifth delay circuit configured to receive a fifth signal having the second pulse width indicating the second type of failure from the determination unit and to delay the received fifth signal for the second predetermined amount of time, and a sixth delay circuit configured to receive a sixth signal having the second pulse width indicating the second type of failure from the determination unit and to delay the received sixth signal for the second predetermined amount of time.

\* \* \* \* \*